United States Patent [19]
Newberry et al.

[11] Patent Number: 5,528,157
[45] Date of Patent: Jun. 18, 1996

[54] INTEGRATED CIRCUIT PACKAGE FOR BURN-IN AND TESTING OF AN INTEGRATED CIRCUIT DIE

[75] Inventors: William R. Newberry, South Portland; Mark A. McClintick, Freeport; Eric Falconer, South Portland; William B. Aronson, Limerick; Mark Lippold, Portland; David W. Joy, Windham, all of Me.

[73] Assignee: National Semiconductor Corporation, Santa Clara, Calif.

[21] Appl. No.: 339,780

[22] Filed: Nov. 15, 1994

[51] Int. Cl.⁶ .................................................. G01R 31/02
[52] U.S. Cl. ........................................... 324/754; 324/760
[58] Field of Search ................................... 324/754, 760; 437/8

[56] References Cited

U.S. PATENT DOCUMENTS

| | | | |
|---|---|---|---|
| 4,801,561 | 1/1989 | Sankhagowit | 437/8 |
| 5,155,067 | 10/1992 | Wood et al. | 437/209 |
| 5,315,239 | 5/1994 | Vitriol | 324/158.1 |
| 5,336,992 | 8/1994 | Saito et al. | 324/754 |
| 5,367,253 | 11/1994 | Wood et al. | 324/754 |
| 5,424,651 | 6/1995 | Green et al. | 324/754 |

*Primary Examiner*—Ernest F. Karlsen
*Assistant Examiner*—Russell M. Kobert
*Attorney, Agent, or Firm*—Hickman Beyer & Weaver

[57] ABSTRACT

A method for and a disassemblable prepackage arrangement for testing and burning-in an integrated circuit die which will be hermetically sealed within and form part of an overall integrated circuit package is herein disclosed. The die has a top and bottom surface and includes a plurality of die input/output terminals. The prepackage comprises a substrate including a top surface. The bottom of the die is disengagably attached to the top surface of the substrate. A lid is disengagably attached to the substrate in a way which hermetically seals the die within a space substantially defined by the substrate and the lid. Thereafter, the die input/output terminals are electrically connecting to external testing equipment for testing and burning-in the die while the die is in a hermetically sealed environment.

22 Claims, 4 Drawing Sheets

5,528,157

INTEGRATED CIRCUIT PACKAGE FOR BURN-IN AND TESTING OF AN INTEGRATED CIRCUIT DIE

BACKGROUND OF THE INVENTION

The present invention relates generally to integrated circuit packaging, and more specifically to testing and burning-in integrated circuit die prior to their being assembled into a final integrated circuit package.

One of the ongoing challenges facing the manufacture of integrated circuit packages is the availability of known good die. This becomes even more significant in the case of multi-chip modules or integrated circuit packages which incorporate more than one die into a package. To achieve the required yields to produce an affordable and reliable multi-chip package, the reliability of the individual die must be determined prior to assembly. Typically, this has been accomplished by electrically connecting each die to test equipment and testing the electrical operation of the die. The die may also be put through a burn-in process which places the die in an elevated temperature environment during its operation causing a high stress situation for the die. This burnin procedure helps to ensure the die will operate in a wide variety of situations. The testing and burn-in process improves the yield of manufactured packages by only using die which have successfully passed the above described testing and burn-in procedures.

Although the testing and burn-in process improves the yield of packages made using die which have successfully passed the testing and burn-in procedures, there are still problems with the current methods. One difficulty with the current method involves the environment in which the die is during the testing and burn-in of the die. When a die is manufactured into its final integrated circuit package, it is typically hermetically sealed into the package using some form of a ceramic enclosure. However, the current method of testing and burning-in a die leaves the die exposed to the ambient air. This allows ambient particles and moisture to potentially cause an otherwise good die to fail as a result of the test. Also, this exposure to the ambient air allows the corrosion of the die by oxidation. As will be seen, the present invention provides a method and arrangement for testing and burning-in an integrated circuit die in a hermetically sealed, disassemblable prepackage which protects the die frown ambient particles and moisture as well as protecting the die from corrosion due to oxidation.

SUMMARY OF THE INVENTION

As will be described in more detail hereinafter, a disassemblable prepackage arrangement for testing and burning-in an integrated circuit die which in most cases will be hermetically sealed within and form part of an overall integrated circuit package is herein disclosed. The die has a top and bottom surface and includes a plurality of die input/output terminals. The arrangement, which is designed in accordance with the present invention, includes a substrate having a top surface, and means for disengagably attaching the bottom surface of the die to the top surface of the substrate. The prepackage arrangement also includes a lid and means for disengagably attaching the lid to the substrate in a way which hermetically seals the die within a space substantially defined by the substrate and the lid. Furthermore, the prepackage arrangement includes means for electrically connecting the die input/output terminals to external testing equipment for testing the die while the die is in a hermetically sealed environment. A method for the testing and burning-in of an integrated circuit die prior to its assembly into a final integrated circuit package is also disclosed.

In a second feature of the present invention, the means for electrically connecting the die input/output terminals to external testing equipment includes an array of bonding wires, each having a ball bond bonded to a respective one of the die input/output terminals. After the completion of the testing, the bonding wires are cut at a point adjacent to the ball bonds such that the ball bonds may act as contacts for the direct surface mounting of the die into its final integrated circuit package.

BRIEF DESCRIPTION OF THE DRAWINGS

The features of the present invention may best be understood by reference to the following description of the presently preferred embodiments together with the accompanying drawings in which.

DETAILED DESCRIPTION OF THE PREFERRED EMBODIMENTS

Figure 1:
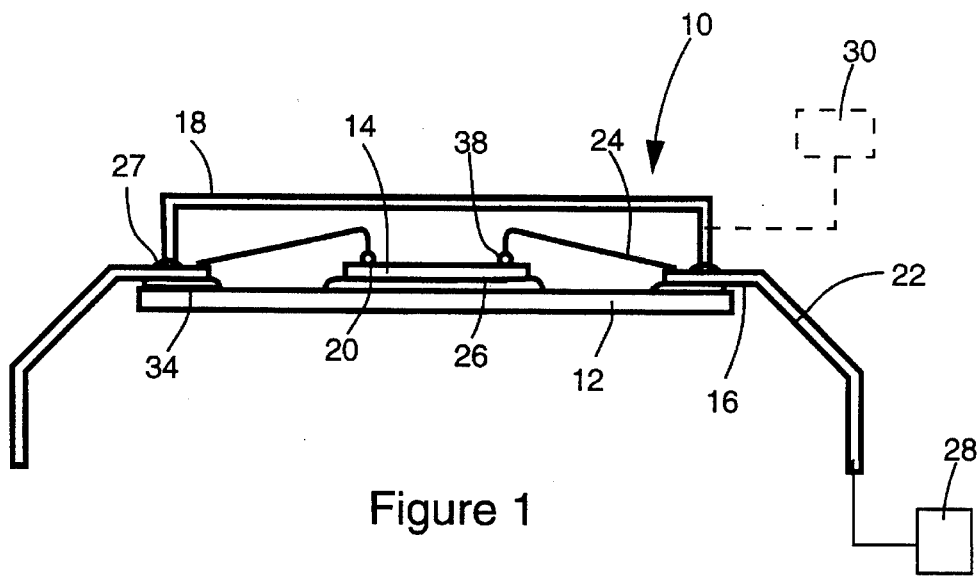
FIG. 1 is a diagrammatic cross-sectional view of a hermetically sealable, disassemblable integrated circuit prepackage, designed in accordance with the present invention, for use in the testing and burning-in of an integrated circuit die.

Referring initially to FIG. 1, a preferred embodiment of a disassemblable integrated circuit prepackage designed in accordance with the present invention and generally designated by reference numeral 10 is illustrated. As will be described in more detail immediately hereinafter, the prepackage includes a substrate 12, a die 14, a lead frame 16, and a lid 18. Die 14 includes a plurality of die input/output terminals 20 and lead frame 16 includes a plurality of electrically conductive leads 22. An array of bonding wires 24 electrically connect each of the die input/output terminals 20 to a respective one of the electrically conductive leads 22. Die 14 and lid 18 are attached to substrate 12 with a reworkable adhesive indicated at 26 and 27 respectively. Leads 22 are electrically connected to test equipment 28 and a heat source 30 is provided to allow for the electrical testing of the die during the burn-in of the die.

The above described prepackage 10, in accordance with the present invention, allows for the complete testing and burning-in of the die in a hermetically sealed, disassemblable prepackage. This prepackage places the die in an environment similar to the environment in which the die will be when it is in its final integrated circuit package. By testing and burning-in the die in a prepackage designed in accordance with the present invention, the die is protected from moisture and particles in the ambient air which may cause unnecessary or incorrect failures as is the case in typical testing and burn-in arrangements. Also, since the die is hermetically sealed within the prepackage, it is protected form oxidation and minimizes any corrosion during these processes.

As will be described in more detail hereinafter, the present invention may be produced and carried out using industry standard manufacturing equipment and industry standard test and burn-in hardware. Also, because all or part of the present inventions integrated circuit die prepackage may be re-used, this method and arrangement provide a low cost, easily automated process for testing and burning-in integrated circuit die while maintaining a hermetically sealed environment for the die during the testing and burn-in process.

Figure 2:
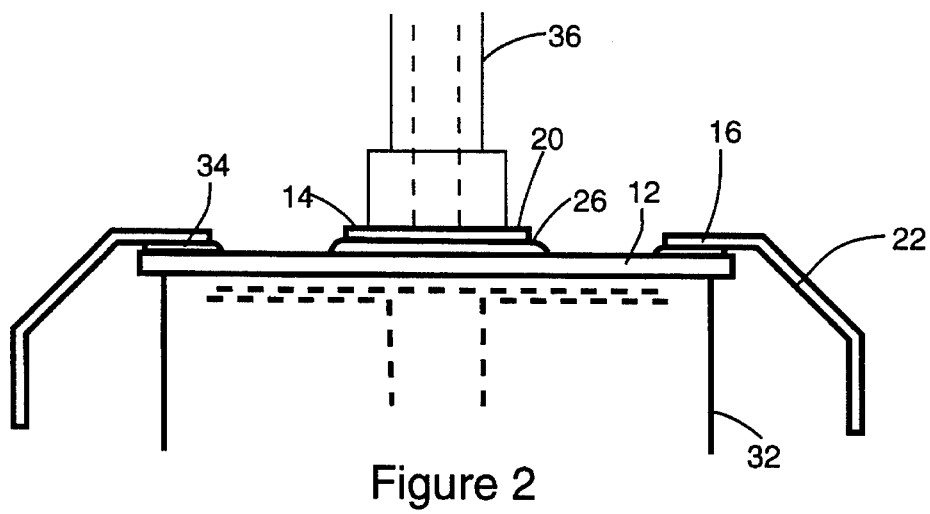
FIG. 2 is a diagrammatic cross-sectional view of the disassemblable prepackage shown in FIG. 1, partially unassembled and illustrating how the die is attached to the substrate.

Referring now to FIG. 2, a method of, and arrangement for testing and burning-in an integrated circuit die according to the present invention will be described in detail. In the presently preferred embodiment, substrate 12 is supported for further operations by a heated vacuum chuck 32. Substrate 12 may be formed using a ceramic material or any other suitable and readily available substrate material. Lead frame 16, including electrically conductive leads 22, is attached to the peripheral portion of the top surface of substrate 12 such that leads 22 extend outwardly beyond the periphery of substrate 12. Lead frame 16 is attached to substrate 12 using a lead embedment glass 34 or some other suitable and readily available material such as an epoxy. A vacuum die bond collet 36 is used to position and attach the bottom surface of die 14 to the top surface of substrate 12 using heat sensitive, reworkable adhesive 26 as shown in FIG. 2. Die 14 is attached to the central portion of substrate 12 such that it is surrounded by lead frame 16 and such that bond pads 20 on the upper surface of die 14 are facing up. Vacuum die bond collet 36 may be a heated vacuum die bond collet in order to heat reworkable adhesive 26, or, in the preferred embodiment of the present invention, this process is done in a furnace to improve the productivity or speed at which this process may be completed.

Figure 3:
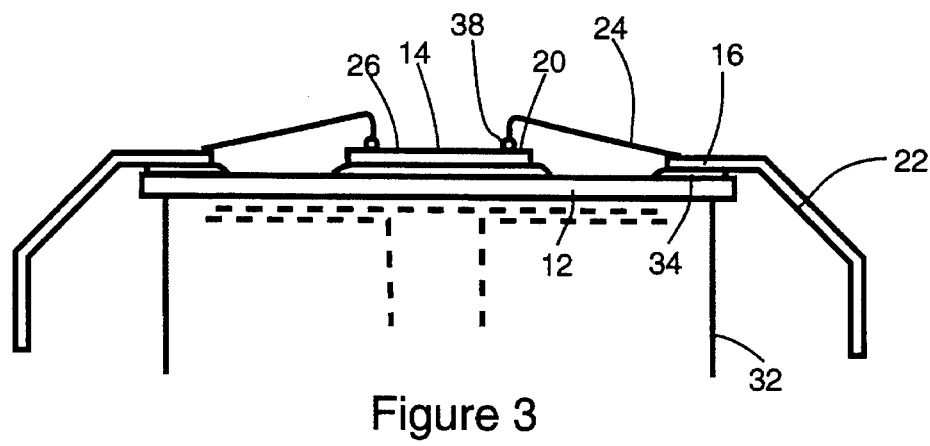
FIG. 3 is a diagrammatic cross-sectional view of the disassemblable prepackage shown in FIG. 1, partially unassembled and illustrating how the die is wire bonded to the lead frame.

Referring now to FIG. 3, die 14 is electrically connected to lead frame 16 using conventional wire bonding equipment. A ball bond 38 is formed on each bond pad 20 of die 14 and bonding wires 24 are formed electrically connecting each bond pad 20 to a respective one of leads 22 on lead frame 16. As will be described in more detail hereinafter, these ball bonds may be used as contacts for connecting die 14 directly to the substrate of its final integrated circuit package after the testing and burn-in of the die is complete.

Figure 4:
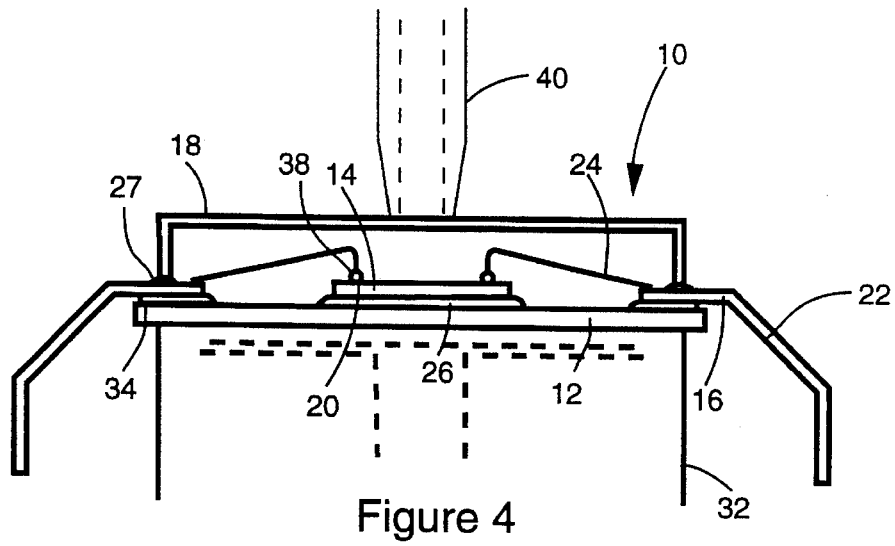
FIG. 4 is a diagrammatic cross-sectional view of the disassemblable prepackage shown in FIG. 1 illustrating how the lid is attached to the substrate.

As shown in FIG. 4, a vacuum pick-up collet 40 is used to attach lid 18 to substrate 12 using reworkable adhesive 27.

In accordance with the present invention, lid 18 is attached in such a way that die 14 is hermetically sealed within the space substantially defined by lid 18 and substrate 12. In the preferred embodiment being described, lid 18 is made from a ceramic material or some other suitable and readily available material. Lid 18 has downwardly projecting sidewalls forming an inverted cup shape. This cup shaped lid encloses die 14, bonding wires 24, and portions of lead frame 16 within a hermetically sealed space when the bottom edge, or rim, of the cup shaped lid is attached to the peripheral portion of the top surface of substrate 12. As shown in FIG. 4, leads 22 project out from lid 18 through lead embedment glass 34 and reworkable adhesive 27 providing means for electrically connecting die 14 to external testing equipment while maintaining a hermetically sealed environment for die 14. As mentioned above for die 14, vacuum pick-up collet 40 may be heated in order to heat adhesive 27 for attaching lid 18 to substrate 12. However, in the preferred embodiment, as mentioned above, this process is done in a furnace which heats the adhesive and improves the productivity or increases the speed at which this process may be completed.

Referring back to FIG. 1, prepackage 10 is next electrically connected to test equipment 28 and placed in a burn-in environment, for example an oven, including heat source 30. Die 14, in accordance with the present invention, may now be fully tested and burned-in while it is in a hermetically sealed environment.

Figure 5:
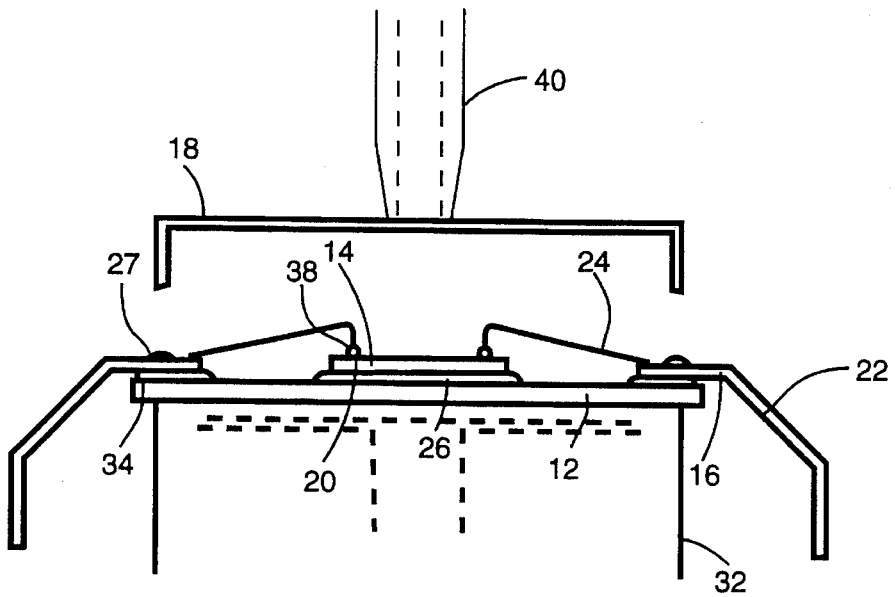
FIG. 5 is a diagrammatic cross-sectional view of the disassemblable prepackage shown in FIG. 1 illustrating how the lid is removed from the substrate after the testing and burn-in is complete.
Figure 6:
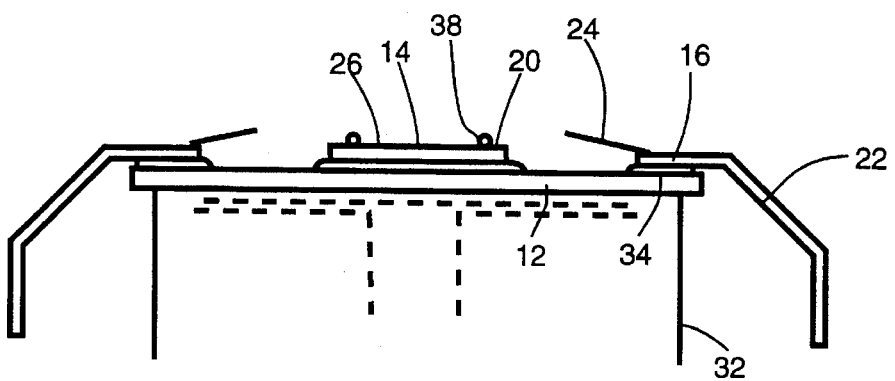
FIG. 6 is a diagrammatic cross-sectional view of the disassemblable prepackage shown in FIG. 1, partially disassembled and illustrating how the bonding wires are cut after the lid is removed.
Figure 7:
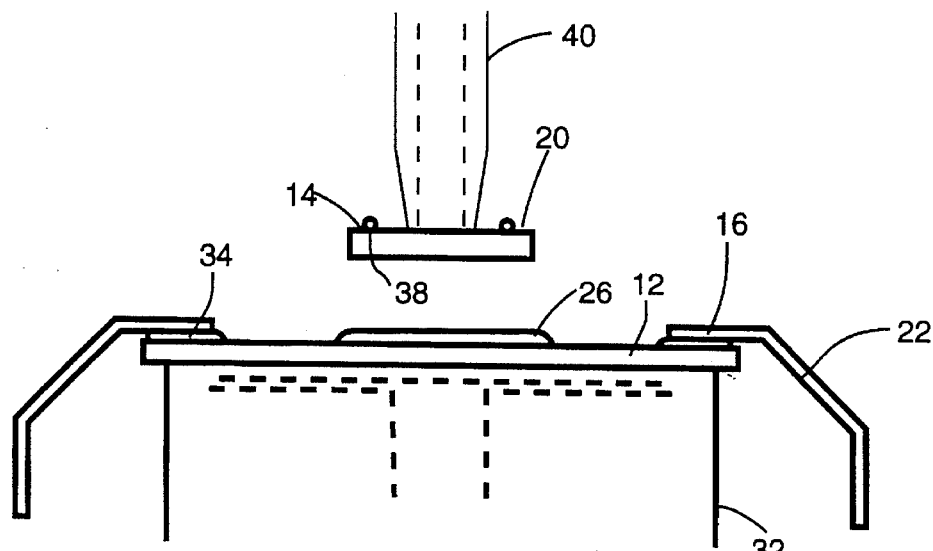
FIG. 7 is a diagrammatic cross-sectional view of the disassemblable prepackage shown in FIG. 1, partially disassembled and illustrating how the die is removed from the substrate after the bonding wires are cut.
Figure 8:
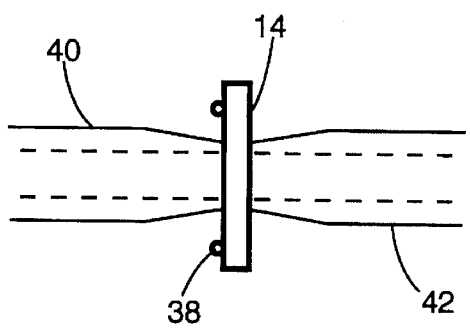
FIG. 8 is a diagrammatic cross-sectional view illustrating how the die is transferred to a vacuum bond tool.

Once the testing and burning-in is complete and as shown in FIG. 5, lid 18 is removed using vacuum chuck 32 to support prepackage 10. Vacuum chuck 32 is heated to soften reworkable adhesive 27 so that vacuum pick-up collet 40 can pick up and remove lid 18. Next, as shown in FIG. 6, bonding wires 24 are cut adjacent to ball bonds 38 leaving ball bonds 38 attached to die band pads 20. A mechanical coin is then performed to ball bonds 38 on die 14 to enhance the planarity of the surfaces of the ball bonds which will later be used as contacts for attaching die 14 to its final package. Bonding wires 24 are also cut adjacent to lead frame 16 which may be later used for the testing of another die. As shown in FIG. 7, vacuum chuck 32 is again heated, softening reworkable adhesive 26. Die 14 is then removed using vacuum pick-up collet 40. Collet 40 picks up die 14 by its top surface which still has ball bonds 38 attached to bonding pads 20 on the die's top surface. Die 14 is then transferred from vacuum pick-up collet 40 to a vacuum bond tool 42, as illustrated in FIG. 8. Vacuum bond tool 42 grips die 14 by its bottom surface or the surface opposite the surface to which the ball bonds are attached.

Figure 9A:
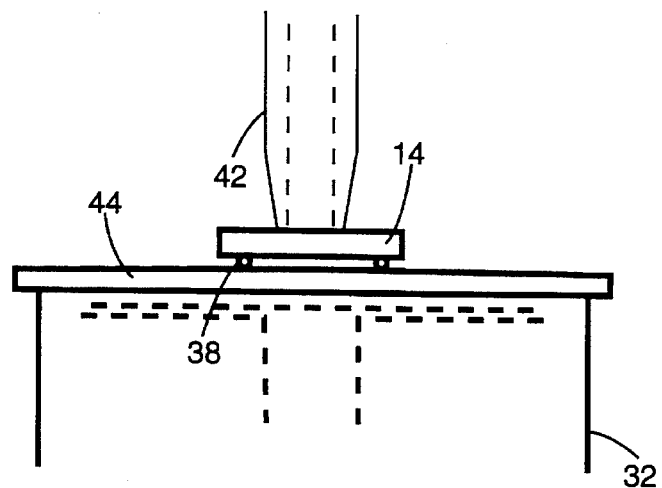
FIGS. 9A–9E are diagrammatic cross-sectional views illustrating how the die is bonded onto a substrate of its final integrated circuit package.
Figure 9B:
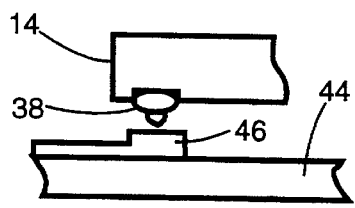
Figure 9C:
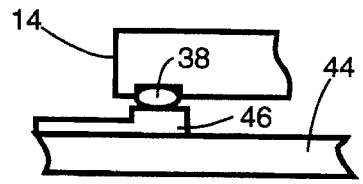
Figure 9D:
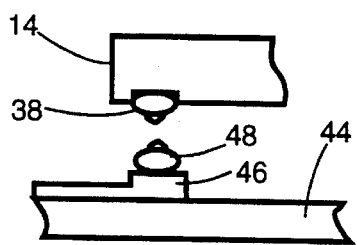
Figure 9E:
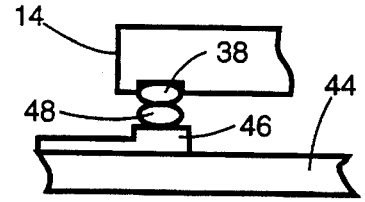

Referring now to FIGS. 9A–E, die 14 is attached directly to a final integrated circuit package substrate 44 using a combination of heat and compression and/or ultrasonics. FIG. 9A illustrates vacuum bond tool 42 positioning die 14 over substrate 44 which is supported by heated vacuum chuck 32. As shown in FIGS. 9B and 9C, the ball bonds 38 on die 14 are used as contacts for electrically connecting die 14 to substrate 44. Ball bonds 38 are aligned with a plurality of bond pads 46 attached to substrate 44. As shown in FIG. 9A, vacuum bond tool 42 applies pressure and/or ultrasonics between die 14 and substrate 44 while vacuum chuck 32 applies heat. This results in a permanent bond between ball bonds 38 and bond pads 46 on substrate 44, as shown in FIG. 9C. Alternatively, as shown in FIGS. 9D and 9E, a plurality of additional ball bonds 48 may be formed on bond pads 46 on substrate 44 forming a contact bump on each of bond pads 46. Die 14 is then attached to substrate 44 in the same way as described above forming a permanent bond as shown in FIG. 9E.

Although only one embodiment of the present invention has been described in detail, it should be understood that the present invention may be embodied in many other specific forms without departing from the spirit or scope of the invention. For instance, several specific pieces of equipment have been described for handling the components which make up the herein described integrated circuit die prepackage. However, the present invention is not limited to an arrangement or method using these specific pieces of equipment, but instead, applies to an arrangement or method for testing and burning-in an integrated circuit die within a hermetically sealed environment regardless of what equipment is used to assemble or disassemble the device in which the die is to be sealed during testing. Also, in the preferred embodiment, a lead frame and an array of bonding wires are used to electrically connect the die to the test equipment. It should be understood that the present invention is not limited to such an arrangement but instead would apply to other arrangements which electrically connect the die to the test equipment as long as the arrangement allows for hermetically sealing the die within a disassemblable prepackage while maintaining the electrical connection to the test equipment. For instance this electrical connection may be accomplished using wires which run directly from the die to the test equipment.

Therefore, the present example is to be considered as illustrative and not restrictive, and the invention is not to be limited to the details given herein, but may be modified within the scope of the appended claims.

What is claimed is:

1. A disassemblable prepackage for use in the testing and burnin of an integrated circuit die which will be disposed within a hermetically sealed environment and within that environment form part of an overall integrated circuit package, said die having a top and bottom surface and including a plurality of die input/output terminals, said prepackage comprising:

a) a substrate including a top surface;
    b) means for disengagably attaching the bottom surface of said die to the top surface of said substrate;
    c) a lid;
    d) means for disengagably attaching said lid to said substrate in a way which hermetically seals said die within a hermetically sealed space substantially defined by said substrate and said lid, said hermetically sealed space being different than said hermetically sealed environment; and
    e) means adapted to electrically connect said die input/output terminals to external testing equipment for testing said die while the die is in a hermetically sealed environment.

2. An arrangement as set forth in claim 1 wherein said substrate includes a ceramic base.

3. An arrangement as set forth in claim 1 wherein the means for attaching said die to said substrate and attaching said lid to said substrate is a reworkable heat softened adhesive.

4. An arrangement as set forth in claim 1 wherein said lid is ceramic.

5. An arrangement as set forth in claim 1 wherein said means adapted to electrically connect said die input/output terminals to external testing equipment includes a lead frame having a plurality of electrically conductive leads, said lead frame being attached to the top surface of said substrate such that said leads extend beyond the periphery of said substrate.

6. An arrangement as set forth in claim 5 wherein a lead embedment glass is used to attach said lead frame to said substrate.

7. An arrangement as set forth in claim 5 wherein said means adapted to electrically connect said die input/output terminals to external testing equipment further includes an array of bonding wires, each bonding wire electrically connecting a respective one of said die input/output terminals to a corresponding one of said leads of said lead frame.

8. An arrangement as set forth in claim 1 wherein said prepackage is electrically connected to testing equipment such that at least some of said die's circuits may be tested while said die is in said hermetically sealed space.

9. An arrangement as set forth in claim 8 wherein said prepackage is placed in an environment having an elevated temperature for burning-in said die.

10. A method for the testing and burning-in of an integrated circuit die prior to its assembly into a final hermetically sealed integrated circuit package, said die having a top and bottom surface and including a plurality of die input/output terminals, said method comprising the steps of:

a) assembling a disassemblable prepackage for said die by, (i) providing a substrate including a top surface, (ii) disengagably attaching said bottom surface of said die to the top surface of said substrate, and (iii) disengagably attaching a lid to said substrate in a way which hermetically seals said die within a hermetically sealed space substantially defined by said substrate and said lid, said hermetically sealed space being different than said final hermetically sealed integrated circuit package; and
    b) electrically connecting said die input/output terminals to external testing equipment for testing said die while the die is in said hermetically sealed space.

11. A method as set forth in claim 10 wherein said substrate includes a ceramic base.

12. A method as set forth in claim 10 wherein the step of attaching said die to said substrate and attaching said lid to said substrate includes using a reworkable heat softened adhesive to attach said die and lid to said substrate.

13. A method as set forth in claim 12 further comprising the step of disassembling said prepackage by, (i) removing said lid, (ii) electrically disconnecting said die, and (iii) removing said die.

14. A method as set forth in claim 13 wherein the step of disassembling said prepackage includes the step of using a heated vacuum chuck to support said prepackage and heat said reworkable adhesive allowing the removal of said lid and said die.

15. A method as set forth in claim 14 wherein the step of disassembling said prepackage includes the step of using a vacuum pick-up collet to grip and remove said lid and said die.

16. A method as set forth in claim 10 wherein said lid is ceramic.

17. A method as set forth in claim 10 wherein said step of electrically connecting said die input/output terminals to external testing equipment includes the steps of providing a lead frame having a plurality of electrically conductive leads and attaching said lead frame to the top surface of said substrate such that said leads extend beyond the periphery of said substrate.

18. A method as set forth in claim 17 wherein a lead embedment glass is used to attach said lead frame to said substrate.

19. A method as set forth in claim 14 wherein said step of electrically connecting said die input/output terminals to external testing equipment further includes the step of forming an array of bonding wires, each one of said bonding wires electrically connecting a respective one of said die input/output terminals to a corresponding one of said leads of said lead frame.

20. A method as set forth in claim 19 wherein the step of forming said array of bonding wires includes the step of forming a ball bond on each of said die input/output terminals, and wherein alter the completion of said testing the method further comprises the step of cutting said bonding wires at a point adjacent to said ball bonds such that said ball bonds may act as contacts for direct surface mounting of said die into its final integrated circuit package.

21. A method as set forth in claim 10 further comprising the step of electrically testing at least some of said die's circuits while said die is in hermetically sealed space.

22. A method as set forth in claim 10 further comprising the step of placing said prepackage in an environment having an elevated temperature for burning-in said die.

* * * * *

UNITED STATES PATENT AND TRADEMARK OFFICE
CERTIFICATE OF CORRECTION

PATENT NO. : 5,528,157
DATED : June 18, 1996
INVENTOR(S) : Newberry et al.

It is certified that error appears in the above-indentified patent and that said Letters Patent is hereby corrected as shown below:

Column 1, line 25, replace "burnin" with --burn in--

Column 1, line 46, replace "frown" with --from--

Column 5, line 31, replace "burnin" with --burn in--

Column 7, line 6, replace "alter" with --after--

Signed and Sealed this

First Day of October, 1996

Attest:

BRUCE LEHMAN

*Attesting Officer*    *Commissioner of Patents and Trademarks*